United States Patent [19]

Berner

[11] 3,753,289

[45] Aug. 21, 1973

[54] PROCESS FOR MANUFACTURE OF SUBSTRATE SUPPORTED SEMICONDUCTIVE STACK

[75] Inventor: Warren E. Berner, Camillus, N.Y.

[73] Assignee: General Electric Company, Syracuse, N.Y.

[22] Filed: Nov. 2, 1970

[21] Appl. No.: 85,961

Related U.S. Application Data

[62] Division of Ser. No. 863,209, Oct. 2, 1969.

[52] U.S. Cl. .................. 29/580, 29/590

[51] Int. Cl. .................. B01j 17/00

[58] Field of Search .................. 29/576 S, 580, 588, 29/583, 576 J, 589, 590

[56] References Cited

UNITED STATES PATENTS

| | | | |
|---|---|---|---|
| 3,503,125 | 3/1970 | Haberecht | 29/576 |
| 3,383,760 | 5/1968 | Schwartzman | 29/577 |
| 3,497,947 | 3/1970 | Ardezzone | 29/577 |
| 3,333,324 | 8/1967 | Rosewell et al. | 29/576 J |
| 3,355,636 | 11/1967 | Becke et al. | 29/576 J |
| 2,798,989 | 7/1957 | Welker | 29/576 UX |

*Primary Examiner*—Charles W. Lanham
*Assistant Examiner*—W. Tupman
*Attorney*—Robert J. Mooney, Nathan J. Cornfeld, Carl O. Thomas, Frank L. Neuhauser, Oscar B. Waddell and Joseph B. Forman

[57] ABSTRACT

A plurality of junction containing semiconductive elements are bonded in series relation with semiconductive attachment elements of low resistivity bonded to opposite ends of the stack to form a semiconductive sub-assembly. The sub-assembly is bonded to metallized spaced lands with the junction containing elements spaced from the intervening surface of the substrate. Electrical conductors are bonded to the metallized lands in spaced relation to the semiconductive sub-assembly. The sub-assembly is etched in position on the lands and thereafter encapsulated with a passivant without intermediate handling. A plastic casement is molded around the sub-assembly and passivant. A plurality of substrates are initially integrally associated.

4 Claims, 4 Drawing Figures

Patented Aug. 21, 1973 3,753,289

2 Sheets-Sheet 1

INVENTOR:
WARREN E. BERNER,

BY Carl O. Thomas
HIS ATTORNEY.

INVENTOR:
WARREN E. BERNER,

BY Carl O. Thomas
HIS ATTORNEY.

PROCESS FOR MANUFACTURE OF SUBSTRATE SUPPORTED SEMICONDUCTIVE STACK

This application is a division of my copending application Ser. No. 863,209, filed Oct. 2, 1969.

I have observed that a number of metals employed in bonding to semiconductive crystals can be more readily adhered to a P-type conductivity surface or an N-type conductivity surface than to a similar semiconductive surface of opposite conductivity characteristics. For example, gold and aluminum form tenacious low impedance bonds by alloying to P-type silicon much more readily than to N-type silicon. At the same time electroless nickel is more readily adhered to N-type silicon than to P-type silicon. Usually, by taking care to control a number of process variables, it is possible to form a tenacious low impedance bond of such metals to both P- and N-type conductivity surfaces. Frequently, however, freedom to impose conditions optimum for bonding to a less favored conductivity type surface is restricted by other considerations. For example, when a semiconductive element or assembly has reached a stage of processing requiring lead attachment, one or more solder bonds and/or diffused junctions may be present that preclude utilizing otherwise acceptable approaches for achieving less readily realizable bonds. In this regard it is to be noted that in the majority of semiconductor devices lead attachments are required to both N- and P-type conductivity surfaces. Thus, it is not surprising that poor lead attachment remains a persistent source of yield loss in the manufacture of semiconductor devices.

Another commonly encountered disadvantage in the manufacture of junction containing semiconductor devices relates to the removal of contaminants from and passivation of the junction at its intersection with the crystal surface. In order to maximize the voltage blocking characteristics of junction surfaces, it is common practice to individually etch the crystals and to individually passivate the crystals immediately thereafter. Thus, for best results with conventional techniques individual processing of crystals is essential. This is not only time consuming, but is frequently difficult to realize where it is desired to associate the crystals in a particular environment for use. That is, some handling which may contribute to recombination after etching is at times necessary in order to place the crystals in the desired environment prior to passivation.

Still another disadvantage encountered in construction of conventional semiconductor devices is that a strictly prescribed relationship is often required between the semiconductive surfaces and leads to be attached thereto. This is particularly true where the semiconductive device is of limited current carrying capacity and, hence, of slight cross-sectional extent, while the leads are required to be formed of comparatively heavy gauge metal in order to serve as the terminal pins for a completed device. In conventional devices the difficulties in bonding heavy gauge pins onto diminutive crystals has led to the use of fly wires and other intermediate connectors and/or the carefully supervised relative placement of leads and crystal.

It is an object of my invention to provide a novel process of manufacture in which the disadvantage of lead attachment to a less favored conductivity type surface is obviated and in which all lead attachments may be identically formed.

It is another object to provide a process for a semiconductor device construction in which wide tolerances may be allowed in the location for attachment of semiconductive sub-assemblies and terminal leads therefor.

It is an additional object to provide a process for manufacture of a semiconductor device in which individual handling of semiconductive elments during etching and passivation is rendered unnecessary and in which repositioning of the semiconductive elements between etching and passivation is rendered unnecessary.

These and other objects of my invention are accomplished in one aspect by providing a process comprising bonding to spaced interconnection surfaces of a semiconductive means low resistivity semiconductive elements to form a semi-conductive sub-assembly. The semiconductive elements are bonded to spaced lands of an insulative substrate configured to engage only the semiconductive elements and to remain free of contact with remaining portions of the semiconductive sub-assembly. The semiconductive means is etched and conductively associated with lead means. The semiconductive means is then protectively encapsulated.

My invention may be better appreciated by reference to the following detailed description considered in conjunction with the claim, in which FIG. 1 is a flow diagram of a process of forming semiconductor devices according to my invention;

Figure 1:
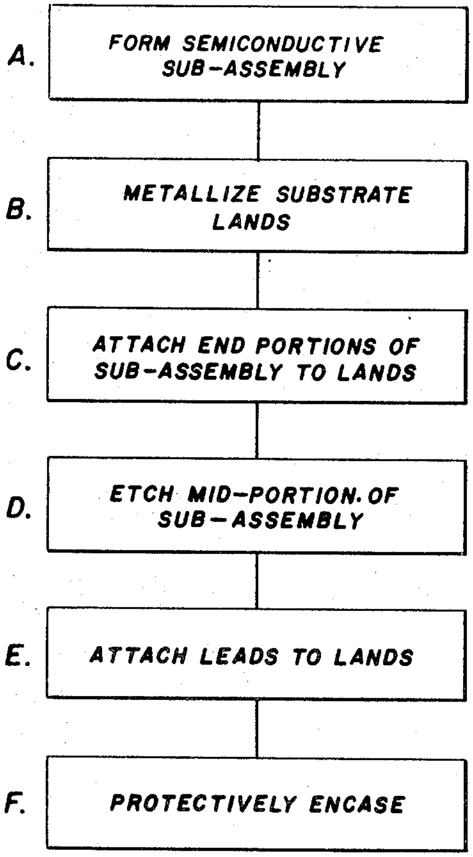

Noting FIG. 1, Step A, my process of forming a semiconductor device is initiated by forming a semiconductive assembly. In a preferred form a semiconductive assembly is comprised of two end-most semiconductive attachment elements bonded to at least one intermediately located junction containing semiconductive element. To provide a simple example, a sub-assembly may be formed suitable for rectification by bonding to spaced interconnection surfaces of a PN junction containing crystal in which one interconnection surface is of P-type conductivity and the remaining surface of opposite conductivity type, two semiconductive attachment elements which may be of either conductivity type. To serve the purposes of my invention the semiconductive attachment elements associated with each sub-assembly are preferably identical and of relatively low resistivity (More than $10^{20}$ impurity atoms/$cm^3$). In the preferred geometrical form the attachment elements should each present a laterally positioned interconnection surface, typically oriented parallel with the longitudinal axis of the sub-assembly, having an areal extent substantially corresponding to or greater than the cross-sectional area of the junction containing semiconductive element.

The bonding material between the attachment element and the adjacent interconnection surface of the junction containing element and between adjacent junction containing elements, if more than one such element is present, may be any conventional bonding material known to be compatible with both P- and N-conductivity type semiconductive surfaces. To provide specific examples, aluminum, gold, and silver may be employed as bonding materials.

According to a preferred bonding process, a plurality of wafers corresponding to attachment and junction containing elements are stacked in the element sequence desired with bonding material plated onto the less readily bonded of adjacent surfaces to be joined. The stacked wafers are brought to the melting point of the bonding material or that of the eutectic which it forms with the semiconductive material to produce a low impedance, tenacious ohmic interconnection between the elements of the sub-assembly. The wafers may be initially over-sized as compared with the desired dimensions of the sub-assembly to allow peripheral portions of semiconductive material to be removed in the process of removing excess bonding material which migrates to the edge during bonding and/or to allow the joined wafers to be sub-divided into a plurality of sub-assemblies of desired configuration. To assure that voids between adjacent wafers are expressed from the stack during bonding the wafers are preferably subjected to compression while the bonding material is in molten form, as by locating a weight on the topmost wafer during heating of the stack. This process of forming a sub-assembly is described in greater detail in my copending application, Ser. No. 863,210, filed on Oct. 2, 1969, titled A PROCESS FOR FORMING LOW IMPEDANCE OHMIC ATTACHMENTS. It is, of course, appreciated that instead of using my preferred bonding procedure other conventional bonding procedures may be readily adapted to the formation of semiconductive sub-assemblies. Attention is directed, for example, to Giacoletto, U.S. Pat. No. 2,702,360, issued Feb. 15, 1955; Haberecht, U.S. Pat. No. 3,274,454, issued Sept. 20, 1966; and Gault, U.S. Pat. No. 3,422,527, issued Jan. 21, 1969; as patent teachings relating to the joining of stacked semiconductive elements to form tenaciously bonded unitary semiconductive sub-assemblies. While these patents do not teach the bonding of end-most attachment elements, this may be readily accomplished in view of my teaching.

Figure 2:
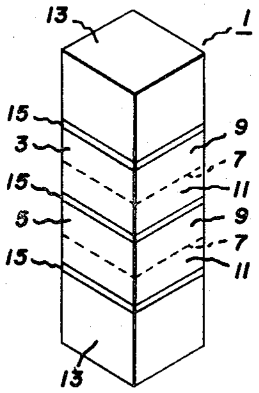
FIG. 2 is an isometric view of a semiconductive sub-assembly.

A preferred semiconductive sub-assembly 1 is shown in FIG. 2. As shown, two junction containing semiconductive elements 3 and 5 are provided. Each of the elements 3 and 5 is shown provided with a junction 7, which divides each element into a zone of P-type conductivity 9 and a zone of N-type conductivity 11. Attachment semiconductive elements 13 of either N- or P-conductivity type are located above and below the junction containing elements. Bonding layers 15 are shown located between the attachment elements and the junction containing elements and between the adjacent junction containing elements. The bonding layers unite the sub-assembly elements into a single unit.

While the semiconductive sub-assembly 1 is shown formed of two junction containing elements, it is appreciated that the number of such units stacked in series relationship may be either increased or decreased, depending upon the voltage characteristics desired for the semiconductor device in which the sub-assembly is to be employed. It is appreciated that the character of the junction containing elements may also be varied, depending upon the electrical application to be satisfied. For example, while I have for simplicity shown a sub-assembly comprised of junction elements each containing a single PN junction, as might be employed in a rectifier application, it is appreciated that one or all of the junction containing elements may be formed with PIN, $P^+PN$, $PNN^+$, PNPN, PNP, NPN, or well known and useful zone relationships. In the preferred form the attachment elements are junctionless and electrically passive, but it is appreciated that the attachment elements could contain one or more junctions, although this is not preferred and in most instances junctions within the attachment elements exhibit very limited voltage blocking capabilities.

Figure 3:
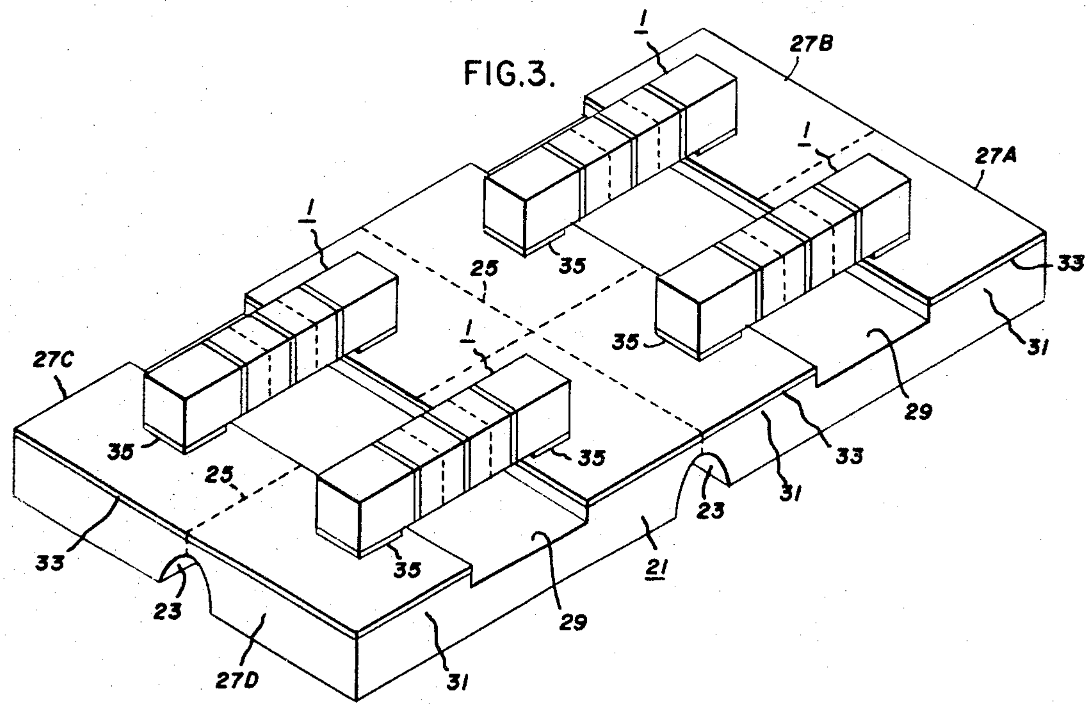
FIG. 3 is an isometric view of a plurality of semiconductive sub-assemblies positioned on a substrate precursor at an intermediate stage of processing.

In FIG. 3 a plurality of sub-assemblies 1 are shown mounted on an insulative substrate precursor 21. The substrate precursor is provided with normally intersecting grooves 23 opening toward its undersurface. The grooves permit the substrate to be readily cleaved through the groove troughs, the planes of cleavage being indicated by dashed lines 25. In the form shown the substrate precursor is sized so that it may be readily separated into quadrants forming four separate substrates 27A, 27B, 27C, and 27D. While the substrate precursor may be broken into separate substrates at any time or the substrates may be initially formed as separate elements, it is generally preferred to defer cleavage into separate substrates at least until the sub-assemblies have been processed through passivation. This allows substantial labor savings in processing by eliminating the necessity of separate handling of substrates and sub-assemblies. It is, of course, appreciated that a substrate precursor may comprise any desired number of substrates and that the sizing of the substrate precursor shown is merely illustrative.

In the form shown, each substrate is traversed by a groove 29 dividing the upper surface of the substrate into spaced lands 31. As indicated by process Step B, FIG. 1, the lands of the substrate are metallized to facilitate attachment of the sub-assemblies to the lands and to provide a low impedance electrical connection to device terminal leads. In FIG. 3 the metallized layer on the substrate is shown at 33. The metallization may be deposited in any conventional manner. For example, the metal may be deposited by vapor plating, sputtering, or electroplating techniques. Alternately, a preformed metal layer may be laminated to the substrate. In order to avoid masking the upper surface of the substrate the metallization may be initially deposited before the upper surface of the substrate is grooved. Formation of the grooves 29 may then be relied upon to restrict metallization to the lands and to provide a high impedance surface intervening the lands.

With the lands metallized the substrates are prepared for attachment of the semiconductive sub-assemblies. The sub-assemblies and grooves 29 are relatively sized so that when the sub-assemblies are positioned only the attachment elements of the sub-assemblies overlie the lands. In the preferred form the attachment elements and lands present broad lateral attachment surfaces. This allows a wide tolerance in the placement of the sub-assemblies while still maintaining the bonding layers 15 and junction containing elements of the sub-assembly entirely spaced from the land metallization and the substrate. Any one of a variety of conventional bonding materials and techniques may be used to join the attachment elements to the metallized lands. According to a preferred procedure the lateral bonding faces of the attachment elements are initially plated with the bonding material before the sub-assembly is mounted in position on the lands to facilitate bonding. In this regard also it is to be noted that the conductivity type of the attachment elements is chosen to be that most readily adherent to the bonding metal.

To provide a specific example, when the bonding layers 15 are formed of aluminum or silver, I have found it advantageous to preliminarily plate gold onto the lands and the lateral interconnection surfaces of the attachment elements. One or more sub-assemblies may then be mounted on the lands in the relationship shown in FIG. 3. Metallization to the attachment elements is indicated at 35. The sub-assemblies and substrate precursor is then heated to a temperature sufficient to bond the attachment elements to the lands. Since gold and gold-silicon eutectics have a melting temperature well below that of either aluminum or silver, there is no tendency of the bonding layers 15 to soften with consequent dissolution of the sub-assemblies. Additionally, the choice of P-conductivity type attachment elements allows a bond of gold to the attachment elements to be more readily achieved than if N-conductivity type attachment elements were employed.

While I prefer to utilize aluminum or silver to form the bonding layers 15 in combination with gold as the bonding metal for the attachment elements, it is to be appreciated that other combinations of bonding metals are contemplated. What I consider essential is that the ohmic connections between the attachment elements and land metallization be formed at a temperature below the softening point of the bonding layers 15. Thus, when gold is used to form the bonding layers 15, for example, a conventional soft solder, such as lead-indium solder, may be employed to bond to the attachment elements and leads. I have observed that while aluminum and gold both bond to P- and N-conductivity type semiconductive surfaces under proper conditions, these metals more readily alloy to P-conductivity type surfaces than N-conductivity type surfaces and accordingly with either of these metals forming the metallization 35, I prefer the attachment elements to be of P-conductivity type. Where, however, a metal such as electroless nickel is used for bonding between the lands and attachment elements, the attachment elements should be of N-conductivity type in keeping with the preferential bonding characteristic of this metal.

With the semiconductive sub-assemblies attached to the substrate precursor the necessity for individually handling or directly touching the sub-assemblies to complete manufacture of semiconductor devices is entirely obviated. Noting process Step D, FIG. 1, the sub-assemblies are positioned on the substrate precursor to allow the junction intersecting peripheries of the elements 3 and 5 to be readily cleaned of contaminants. The grooves 29 allow ready access to all surfaces of the elements intersected by the junctions 7. It is, of course, recognized that as an alternative to providing the grooves 29 for this purpose, the height of the metallization 35 may be increased to similarly allow access to the undersurfaces of the sub-assemblies. I prefer to clean the sub-assemblies in situ by flowing a conventional cleaning etchant over the mid-portions of the sub-assemblies—that is, over the periphery of the elements 3 and 5. By flowing an etchant over the sub-assemblies rather than mounting the sub-assemblies and substrate in an etchant bath I minimize back plating (redeposition) of contaminants entrained in the etchant and the consequent degradation of junction voltage blocking characteristics attributable to back plating. The grooves 29 may be used to drain away etchant with minimal contact to the metallized areas and the remaining semiconductive elements.

Electrical conductors, typically terminal leads, for conducting electricity with respect to each sub-assembly when incorporated as part of a semiconductor device may be accomplished before or after the substrate precursor is cleaved into separate substrates. The attachment of leads to the lands as called for by Step E, FIG. 1, is easily accomplished, since the land presents a comparatively large area for interconnection. This allows the lead to be bonded to the metallization of the lands without any great degree of accuracy in placement. Additionally, it is not essential that the lead actually engage the semiconductive sub-assembly. Accordingly, the disadvantage of bonding relatively heavy gauge terminal leads to small cross-sectional area semiconductive crystals, as is encountered in the manufacture of conventional devices, is eliminated.

Figure 4:
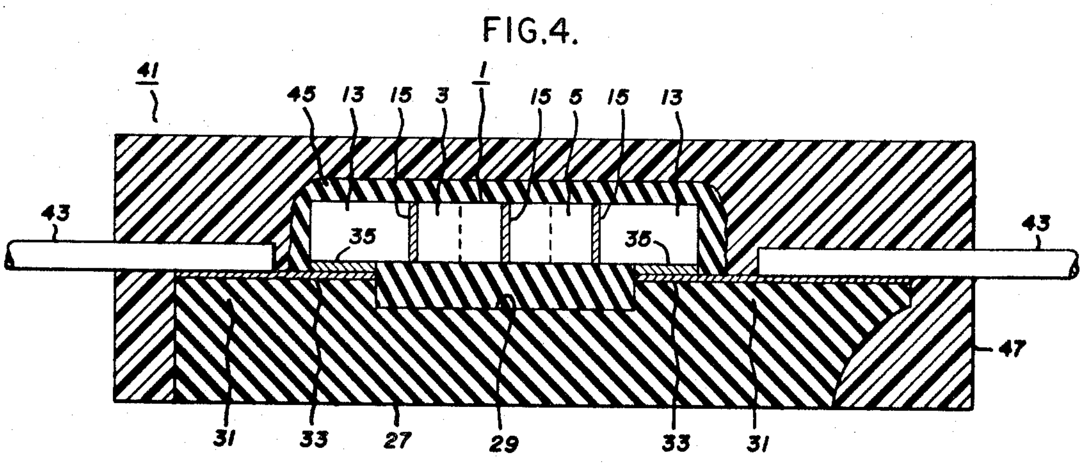
FIG. 4 is a sectional view, with portions schematically shown, of a semiconductor device according to my invention.

A completed semiconductor device 41 constructed according to my invention is shown in vertical section in FIG. 4. The insulative substrate 27 is provided with metallization 33 on the surface of the lands 31 separated by groove 29. The semiconductive sub-assembly 1 is supported by its attachment elements 13 and bonded to the lands by metallization 35. The junction containing semiconductive elements 3 and 5 together with the bonding layers 15 are spaced from the substrate and metallization associated with the lands. Electrical conductors 43 shown as terminal leads are bonded to the metallization 33 and are spaced laterally from the semiconductive sub-assembly, so that the metallization provides the conductive path therebetween.

A body of passivation material 45 encapsulates the semiconductive sub-assembly. The passivation material may be of any conventional type. In the preferred form a body of silicone rubber is placed around the semiconductive sub-assembly and allowed to cure. The silicone rubber is preferably supplemented by a silicone varnish. The function of the passivant, of course, is to protect the semiconductive sub-assembly junctions from contaminant materials which could adversely affect the electrical operating characteristics of the device. It is to be noted that the clearance between the substrate and the undersurface of the semiconductive sub-assembly permits the passivant to bond all peripheral surfaces of the sub-assembly intersected by the junctions. The step of locating the passivant to protect the junctions while designated as Step F, FIG. 1, may be accomplished either before or after lead attachment or sub-division of the substrate precursor into separate substrates. Preferably the step of passivation is accomplished before lead attachment and while the substrates are still integrally joined. A plastic casement 47, which may be formed of phenolic, silicone, or epoxy resin, as is well understood in the art, is shown formed around the passivant and substrate. Where the plastic casement is formed prior to sub-division of the substrate precursor, as is compatible with the multiple unit handling concept of my invention, the casement need not extend laterally beyond the substrate with which it is associated. It is appreciated that devices may be formed according to my invention utilizing hermetic encapsulation rather than a plastic casement as shown.

While I have described my invention with reference to a preferred embodiment, it is appreciated that alternate forms will readily occur to those skilled in the art.

What I claim and desire to secure by Letters Patent of the United States is:

1. A process comprising bonding to spaced interconnection surfaces of a semiconductive means low resistivity semiconductive elements to form a semiconductive sub-assembly, bonding the semiconductive elements to spaced lands of an insulative substrate configured to engage only the semiconductive elements to remain free of contact with remaining portions of the semiconductive sub-assembly, etching the semiconductive means, conductively associating lead means with the semiconductive elements, and protectively encapsulating the semiconductive means.

2. A process according to claim 1 in which the semiconductive means is formed by bonding a plurality of junction containing semiconductive elements in series relation concurrently with bonding the low resistivity semiconductive elements.

3. A process according to claim 1 in which the semiconductive elements are bonded to the lands at a temperature below that employed to bond the semiconductive elements to the semiconductive means.

4. A process according to claim 1 additionally including the steps of sub-dividing a plurality of semiconductive sub-assemblies from a stack of semiconductive wafers, bonding the sub-assemblies to a plurality of integrally and separately related substrates, etching the semiconductive means while the substrates remain integrally related, and thereafter separating the substrates into discrete substrates.

* * * * *